US012624440B2

(12) United States Patent
Niu et al.

(10) Patent No.: US 12,624,440 B2
(45) Date of Patent: May 12, 2026

(54) SURFACE TREATMENT METHOD

(71) Applicant: ASUSTEK COMPUTER INC., Taipei (TW)

(72) Inventors: Er-Bao Niu, Taipei (TW); Po-Wen Huang, Taipei (TW); Yu-Chun Yang, Taipei (TW); Guo-Lin Yang, Taipei (TW); Tao Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 18/901,662

(22) Filed: Sep. 30, 2024

(65) Prior Publication Data

US 2025/0376755 A1 Dec. 11, 2025

(30) Foreign Application Priority Data

Jun. 5, 2024 (TW) .................................. 113120829

(51) Int. Cl.
*C25D 11/18* (2006.01)
*C23C 14/12* (2006.01)
*C23C 14/24* (2006.01)
*C23C 14/35* (2006.01)

(52) U.S. Cl.
CPC .............. *C23C 14/12* (2013.01); *C23C 14/24* (2013.01); *C23C 14/35* (2013.01); *C25D 11/18* (2013.01)

(58) Field of Classification Search
None
See application file for complete search history.

(56) References Cited

U.S. PATENT DOCUMENTS 11,330,732 B2 5/2022 Kim et al.
2025/0215603 A1 * 7/2025 Jeong ..................... C25D 11/18

FOREIGN PATENT DOCUMENTS

CN      103088389 B      7/2015
CN      114150283 A      3/2022
JP      2018009088 A  *  1/2018

OTHER PUBLICATIONS

Machine translation of Takushi et al. JP 2018009088 A (Year: 2018).*

* cited by examiner

*Primary Examiner* — Wojciech Haske
(74) *Attorney, Agent, or Firm* — MUNCY, GEISSLER, OLDS & LOWE, P.C.

(57) ABSTRACT

A surface treatment method is provided, applicable to a housing. The housing includes a surface. The surface treatment method includes: performing anodic treatment on the surface, to form a microporous structure on the surface; depositing a silicon material on the surface, to form a silicon polymer material layer to fill the microporous structure; and depositing a fluorine-containing monomer material on the surface, where the silicon polymer material layer reacts with the fluorine-containing monomer material to generate a silicon-fluorine polymer mixture structure film to perform pore sealing on the microporous structure.

10 Claims, 2 Drawing Sheets

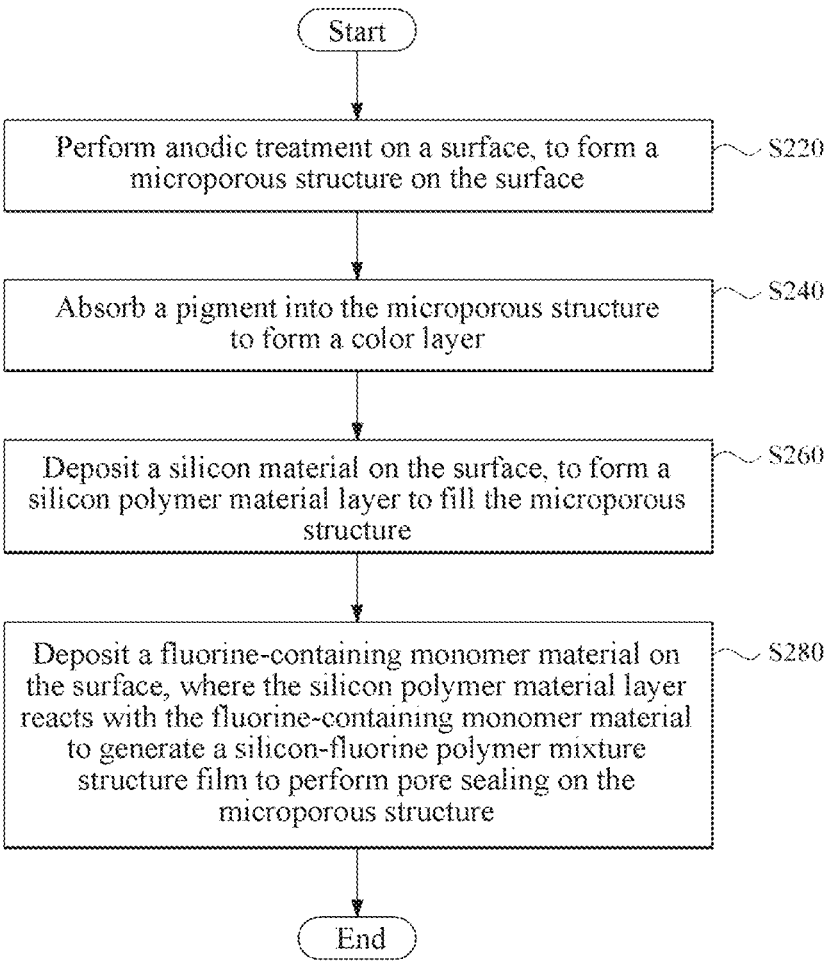

Start

Perform anodic treatment on a surface, to form a microporous structure on the surface — S220

Absorb a pigment into the microporous structure to form a color layer — S240

Deposit a silicon material on the surface, to form a silicon polymer material layer to fill the microporous structure — S260

Deposit a fluorine-containing monomer material on the surface, where the silicon polymer material layer reacts with the fluorine-containing monomer material to generate a silicon-fluorine polymer mixture structure film to perform pore sealing on the microporous structure — S280

End

FIG. 2

SURFACE TREATMENT METHOD

CROSS-REFERENCE TO RELATED APPLICATION

This application claims the priority benefit of Taiwan Application Serial No. 113120829, filed on Jun. 5, 2024. The entirety of the above-mentioned patent application is hereby incorporated by reference herein and made a part of the specification.

BACKGROUND OF THE INVENTION

Field of the Invention

The disclosure relates to a surface treatment method, and in particular, to pore sealing treatment of the surface treatment method.

Description of the Related Art

Conventional pore sealing technologies include manners such as low-temperature fluoride pore sealing, medium-temperature nickel salt pore sealing, high-temperature nickel salt pore sealing, and vapor pore sealing. Pore sealing agents used in the pore sealing technologies all generate a chemical reaction with a color layer. As a result, a color value of the color layer is changed, in an embodiment, resulting in a significant decrease in blackness of a black color, affecting appearance presentation of a product.

In addition, a main component of the pore sealing agent used in the conventional pore sealing technology is nickel salt, which does not have a lotus effect. As a result, a fingerprint cannot be effectively prevented from generating.

BRIEF SUMMARY OF THE INVENTION

The disclosure provides a surface treatment method, applicable to a housing, where the housing includes a surface, and the surface treatment method includes: performing anodic treatment on the surface, to form a microporous structure on the surface; depositing a silicon material on the surface, to form a silicon polymer material layer to fill the microporous structure; and depositing a fluorine-containing monomer material on the surface, where the silicon polymer material layer reacts with the fluorine-containing monomer material to generate a silicon-fluorine polymer mixture structure film to perform pore sealing on the microporous structure.

According to a surface treatment method provided in the disclosure, a user only needs to input a first gesture signal and at least one track signal in a touch manner, so that operation steps of image generation can be completed, thereby facilitating simplifying an operation procedure and integrating the whole operation procedure into a touch module, to improve operation efficiency of the user.

BRIEF DESCRIPTION OF THE DRAWINGS

FIG. 2 is a flowchart of a surface treatment method according to another embodiment of the disclosure.

DETAILED DESCRIPTION OF THE EMBODIMENTS

Figure 1:
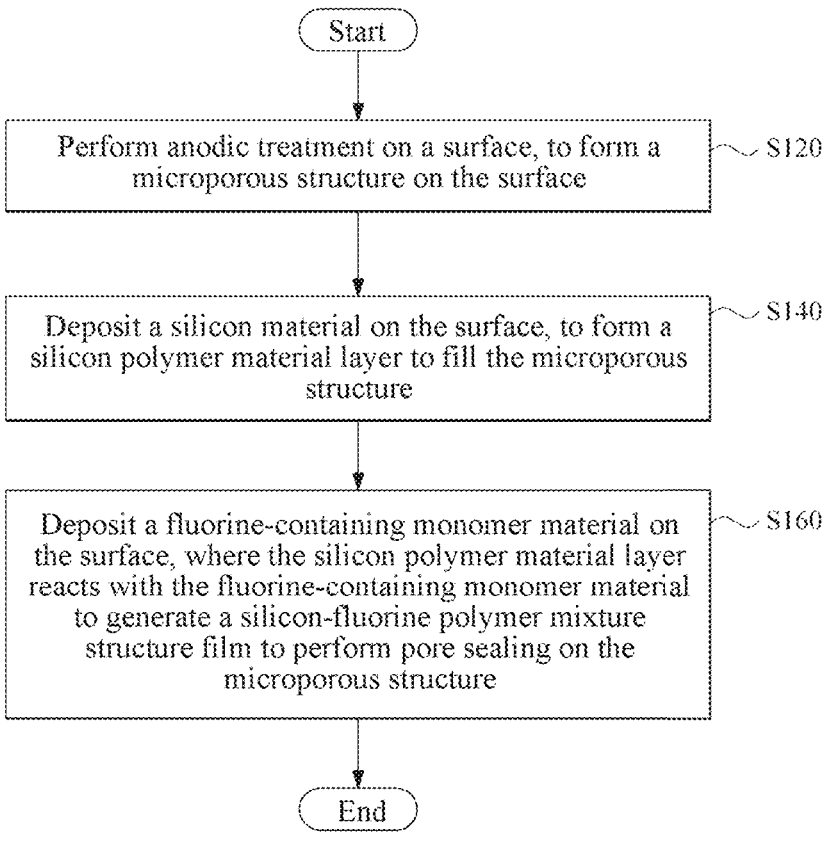
FIG. 1 is a flowchart of a surface treatment method according to an embodiment of the disclosure.

Specific embodiments of the disclosure are described in detail below with reference to schematic diagrams. Advantages and features of the disclosure are more apparent from the following descriptions and application patent scope. It is to be noted that, the drawings are drawn by using an extremely simplified form and imprecise proportion, which are only used for conveniently and clearly assisting in explaining the objective of the embodiments of the disclosure.

FIG. 1 is a flowchart of a surface treatment method according to an embodiment of the disclosure. The surface treatment method is applicable to a housing, where the housing is made of aluminum alloy, and includes a surface.

The surface treatment method includes the following steps.

First, as described in step S120, anodic treatment is performed on the surface, to form a microporous structure on the surface. In addition, in the step, a protective oxide layer is formed on the surface of the housing.

In an anodic treatment technology, a microporous shape is formed on a molecular structure of the surface of the housing by using an electrochemical reaction, and a surface protective oxide layer is generated. The anodic treatment technology used in this embodiment is a conventional anodic treatment technology, and is not a technical focus of the disclosure. Details are not described herein.

Then, as described in step S140, a silicon material is deposited on the surface, to form a silicon polymer material layer to fill the microporous structure. Specifically, the silicon polymer material layer generated in the disclosure is formed by an alternate combination of silicon and oxygen, or is understood as an organosilicon compound.

In an embodiment, step S140 includes: depositing the silicon material on the surface in a vacuum environment or in an inert gas environment by using a magnetron sputtering process. The magnetron sputtering process enables a silicon molecule to be adsorbed in a pore of an object, to forms a silicon polymer material layer on the surface (including a side wall and a bottom surface of the microporous structure). In an embodiment, a target material used in the magnetron sputtering process is a liquid or solid silicon polymer material. The inert gas prevents a silicon polymer material from generating a reaction during the sputtering process, so that chemical activity of the silicon polymer material remains stable.

The silicon polymer material layer protects a substrate material located below the layer, and also facilitates a subsequent pore sealing processes. In an embodiment, a thickness of the silicon polymer material layer ranges from 5 nm to 10 nm.

In the foregoing embodiments, the silicon polymer material layer is formed by using the magnetron sputtering process, to fill the microporous structure. However, the disclosure is not limited thereto. In another embodiment, the step of depositing the silicon material on the surface includes: coating the silicon material on the surface of the housing by using a spray coating process.

Next, as described in step S160, a fluorine-containing monomer material is deposited on the surface, where the silicon polymer material layer reacts with the fluorine-containing monomer material to generate a silicon-fluorine polymer mixture structure film to perform pore sealing on the microporous structure. The silicon-fluorine polymer mixture structure film is gradually grown from micropores of the microporous structure, to complete a pore sealing process from inside to outside (of the microporous).

In an embodiment, the fluorine-containing monomer material includes a cyano-fluorine polymer material. In an embodiment, the silicon-fluorine polymer mixture structure film generated by the reaction of the silicon polymer material layer and the fluorine-containing monomer material is made of a silicon-fluorine modified polymer material.

In an embodiment, the step of depositing the fluorine-containing monomer material on the surface includes: depositing the fluorine-containing monomer material on the surface in a vacuum environment by using a vapor deposition process. In an embodiment, an operating temperature of the vapor deposition process ranges from 60° C. to 85° C. Specifically, the vapor deposition process in the vacuum environment makes a fluorine monomer adsorbed into a silicon polymer layer, and the silicon polymer layer reacts with the fluorine monomer to generate the silicon-fluorine polymer mixture structure film. In an embodiment, a thickness of the silicon-fluorine polymer mixture structure film ranges from 6 nm to 10 nm.

In the foregoing embodiments, the fluorine-containing monomer material is deposited on the surface of the housing by using a vacuum vapor deposition process. However, the disclosure is not limited thereto. In another embodiment, the step of depositing the fluorine-containing monomer material on the surface includes: coating the fluorine-containing monomer material on the surface by using a spray coating process.

A main component of the silicon-fluorine polymer mixture structure film for pore sealing in the disclosure is a silicon-fluorine modified polymer structure generated through a synthesis reaction of silicon and a fluoropolymer, and a dialysis degree of the silicon-fluorine polymer mixture structure film reaches 99%, so that a molecular structure is effectively maintained to be absorbed on a surface of an object for a long time.

In addition, compared with a conventional pore sealing agent (where a main component thereof is nickel salt), a surface of the silicon-fluorine polymer mixture structure film for pore sealing in the disclosure is presented as an atomic structure having a lotus effect, and is directly used as an anti-fouling and anti-fingerprint coating layer, thereby facilitating simplifying a procedure of a housing surface treatment process and reducing costs of the housing surface treatment process.

In addition, before the step of performing anodic treatment in S120, surface cleaning steps such as pretreatment and cleaning are performed on the surface of the housing. In an embodiment, a flow reaction is performed between an alcohol compound or a ketone compound and dirt on the surface of the housing, and reaction time ranges from 30 minutes to 60 minutes, to remove impurities such as dirt and an oil stain on the surface of the housing. Then, further cleaning is performed on the surface of the housing by using pure water in combination with an ultrasonic wave, and cleaning time exceeds 60 minutes.

FIG. 2 is a flowchart of a surface treatment method according to another embodiment of the disclosure. The surface treatment method is applicable to a housing, where the housing is made of aluminum alloy, and includes a surface.

The surface treatment method includes the following steps.

First, as described in step S220, anodic treatment is performed on the surface, to form a microporous structure on the surface.

Then, as described in step S240, a pigment is adsorbed into the microporous structure to form a color layer. In the step, the pigment is filled into the microporous structure by using a spray coating process or the like. The step is a coloring step.

Then, as described in step S260, a silicon material is deposited on the surface, to form a silicon polymer material layer to fill the microporous structure.

Next, as described in step S280, a fluorine-containing monomer material is deposited on the surface, where the silicon polymer material layer reacts with the fluorine-containing monomer material to generate a silicon-fluorine polymer mixture structure film to perform pore sealing on the microporous structure.

A main component of the silicon-fluorine polymer mixture structure film for pore sealing in the disclosure is a silicon-fluorine modified polymer structure generated through a synthesis reaction of silicon and a fluoropolymer, and a dialysis degree of the silicon-fluorine polymer mixture structure film reaches 99%, so that a molecular structure is effectively maintained to be absorbed on a surface of an object for a long time.

Furthermore, compared with a conventional pore sealing agent (where a main component thereof is nickel salt), the silicon-fluorine polymer mixture structure film for pore sealing in the disclosure does not generate chemical and physical reactions with the color layer, so that the color layer is protected more effectively, to prevent a change in a color value of the color layer. In an embodiment, there is a significant decrease in blackness of a black color, thereby facilitating maintaining an original color of the color layer.

In addition, compared with a conventional pore sealing agent (where a main component thereof is nickel salt), a surface of the silicon-fluorine polymer mixture structure film for pore sealing in the disclosure is presented as an atomic structure having a lotus effect, and is directly used as an anti-fouling and anti-fingerprint coating layer, thereby facilitating simplifying a procedure of a housing surface treatment process and reducing costs of the housing surface treatment process.

The foregoing are merely preferred embodiments of the disclosure, and do not limit the disclosure. A person skilled in the art makes any form of equivalent substitutions, modifications, or other changes to the technical means and technical content provided in the disclosure without departing from a scope of the technical means of the disclosure, and all the substitutions, modifications, or other changes do not depart from the content of the technical means of the disclosure, and still fall within the scope of protection of the disclosure.

What is claimed is:

1. A surface treatment method, applicable to a housing, wherein the housing comprises a surface, and the surface treatment method comprises:

performing anodic treatment on the surface, to form a microporous structure on the surface;

depositing a silicon material on the surface, to form a silicon polymer material layer to fill the microporous structure; and depositing a fluorine-containing monomer material on the surface, wherein the silicon polymer material layer reacts with the fluorine-containing monomer material to generate a silicon-fluorine polymer mixture structure film to perform pore sealing on the microporous structure, wherein the step of depositing the silicon material on the surface comprises depositing the silicon material on the surface in a vacuum environment by using a magnetron sputtering process, wherein the silicon polymer material is an organosilicon compound with an alternate silicon and oxygen structure, and wherein the fluorine-containing monomer material comprises a cyano-fluorine monomer material.

2. The surface treatment method according to claim 1, wherein the housing is made of aluminum alloy.

3. The surface treatment method according to claim 1, wherein the step of depositing the fluorine-containing monomer material on the surface comprises depositing the fluorine-containing monomer material on the surface in a vacuum environment by using a vapor deposition process.

4. The surface treatment method according to claim 3, wherein an operating temperature of the vapor deposition process ranges from 60° C. to 85° C.

5. The surface treatment method according to claim 1, wherein a thickness of the silicon polymer material layer ranges from 5 nm to 10 nm.

6. The surface treatment method according to claim 1, wherein a thickness of the silicon-fluorine polymer mixture structure film ranges from 6 nm to 10 nm.

7. The surface treatment method according to claim 1, wherein the step of depositing the silicon material on the surface comprises: coating the silicon material on the surface by using a spray coating process.

8. The surface treatment method according to claim 1, wherein the step of depositing the fluorine-containing monomer material on the surface comprises coating the fluorine-containing monomer material on the surface by using a spray coating process.

9. The surface treatment method according to claim 1, wherein before the step of depositing the silicon material on the surface, the surface treatment method further comprises absorbing a pigment into the microporous structure.

10. The surface treatment method according to claim 1, wherein the silicon-fluorine polymer mixture structure film is made of a silicon-fluorine modified polymer material.

* * * * *